(12) United States Patent
Yuan et al.

(10) Patent No.: US 12,426,441 B2
(45) Date of Patent: Sep. 23, 2025

(54) DISPLAY SUBSTRATE AND DISPLAY DEVICE

(71) Applicants: Hefei BOE Joint Technology Co., Ltd., Anhui (CN); BOE TECHNOLOGY GROUP CO., LTD., Beijing (CN)

(72) Inventors: Can Yuan, Beijing (CN); Meng Li, Beijing (CN); Yongqian Li, Beijing (CN); Zhidong Yuan, Beijing (CN); Dacheng Zhang, Beijing (CN)

(73) Assignees: Hefei BOE Joint Technology Co., Ltd., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 606 days.

(21) Appl. No.: 17/773,501

(22) PCT Filed: Mar. 12, 2021

(86) PCT No.: PCT/CN2021/080390
§ 371 (c)(1),
(2) Date: Apr. 29, 2022

(87) PCT Pub. No.: WO2021/218438
PCT Pub. Date: Nov. 4, 2021

(65) Prior Publication Data
US 2023/0006023 A1      Jan. 5, 2023

(30) Foreign Application Priority Data

Apr. 27, 2020    (CN) ........................ 202010345041.X

(51) Int. Cl.
*H10K 59/121*    (2023.01)
*H10K 50/86*     (2023.01)
(Continued)

(52) U.S. Cl.
CPC ......... *H10K 59/121* (2023.02); *H10K 50/865* (2023.02); *H10K 59/1213* (2023.02);
(Continued)

(58) Field of Classification Search
CPC ............. H10K 59/131; H10K 59/1213; H10K 59/1216; H10K 59/8792; H10K 59/121;
(Continued)

(56) References Cited

U.S. PATENT DOCUMENTS

| 10,811,484 B2 | 10/2020 | Kim et al. |
| 2008/0258618 A1 | 10/2008 | Chung et al. |

(Continued)

FOREIGN PATENT DOCUMENTS

| CN | 102280448 A | 12/2011 |
| CN | 109979970 A | 7/2019 |

(Continued)

*Primary Examiner* — Matthew L Reames
(74) *Attorney, Agent, or Firm* — HOUTTEMAN LAW LLC

(57) ABSTRACT

Provided are a display substrate and a display device. The display substrate includes a base substrate, and gate lines extending in a first direction, data lines extending in a second direction and pixel units that are on the base substrate, the first direction intersecting the second direction; each pixel unit including sub-pixels, each sub-pixel including a pixel circuit; the pixel circuit including at least a switching transistor, a drive transistor, a sensing transistor, and a storage capacitor; for each pixel circuit, the switching transistor, the drive transistor, and the sensing transistor therein are all on a same side of the storage capacitor; the switching transistor is at an intersection of the gate line and the data line connected thereto, and the switching transistor is adjacent to the sensing transistor in the first direction and adjacent to the drive transistor in the second direction.

18 Claims, 11 Drawing Sheets

(51) Int. Cl.
*H10K 59/131* (2023.01)
*H10K 59/35* (2023.01)
*H10K 59/80* (2023.01)

(52) U.S. Cl.
CPC ....... *H10K 59/1216* (2023.02); *H10K 59/351* (2023.02); *H10K 59/353* (2023.02); *H10K 59/8792* (2023.02); *H10K 59/131* (2023.02)

(58) Field of Classification Search
CPC ... G09G 2300/0426; G09G 2300/0452; G09G 3/3208
See application file for complete search history.

(56) References Cited

U.S. PATENT DOCUMENTS

| | | | |
|---|---|---|---|
| 2012/0061802 A1* | 3/2012 | Nicholas | H10D 10/311 257/E29.174 |
| 2016/0027374 A1* | 1/2016 | Meng | G09G 3/2003 345/694 |
| 2017/0193876 A1* | 7/2017 | Choi | H10K 59/131 |
| 2017/0352312 A1* | 12/2017 | Ebisuno | G09G 3/3233 |
| 2018/0374439 A1* | 12/2018 | Ma | G09G 3/3648 |
| 2019/0206971 A1* | 7/2019 | Kim | H10K 59/123 |
| 2022/0045161 A1 | 2/2022 | Li et al. | |

FOREIGN PATENT DOCUMENTS

| | | |
|---|---|---|
| CN | 110265408 A | 9/2019 |
| CN | 110718575 A | 1/2020 |
| CN | 111179828 A | 5/2020 |
| CN | 111524945 A | 8/2020 |
| JP | 2016114805 * | 7/2017 |

* cited by examiner

DISPLAY SUBSTRATE AND DISPLAY DEVICE

TECHNICAL FIELD

The present disclosure belongs to the field of display technology, and in particular, relates to a display substrate and a display device.

BACKGROUND

An organic light-emitting diode (OLED) display substrate is a display substrate that is different from the traditional liquid crystal display (LCD), and has advantages of active illumination, good temperature characteristics, low power consumption, fast response, flexibility, ultra-thinness, low cost, etc. Therefore, it has become one of the important development discoveries of a new generation of display devices, and has attracted more and more attention.

SUMMARY

The present disclosure aims to provide a display substrate and a display device to solve at least one of the technical problems existing in the related art.

In a first aspect, an embodiment of the present disclosure provides a display substrate which includes a base substrate, and a plurality of gate lines extending in a first direction, a plurality of data lines extending in a second direction and a plurality of pixel units that are on the base substrate, the first direction intersecting the second direction;

each of the plurality of pixel units includes a plurality of sub-pixels, each of the plurality of sub-pixels including a pixel circuit; the pixel circuit includes at least a switching transistor, a drive transistor, a sensing transistor, and a storage capacitor;

for each pixel circuit, the switching transistor, the drive transistor, and the sensing transistor of the pixel circuit are all on a same side of the storage capacitor; the switching transistor is at an intersection of the gate line and the data line that are coupled to this switching transistor, and the switching transistor is adjacent to the sensing transistor in the first direction, and adjacent to the drive transistor in the second direction.

In some embodiments, the plurality of pixel units are arranged in plurality of columns in the first direction, and are arranged in a plurality of rows in the second direction; the plurality of sub-pixels in each pixel unit are arranged in two rows in the second direction, and the sub-pixels in each row are arranged in the first direction;

for the pixel units in a same row, the gates of the switching transistors of the pixel circuits are coupled to a same gate line;

for the pixel units in a same column, the switching transistors of the pixel circuits in which organic electroluminescent diodes emit light with a same color are coupled to a same data line.

In some embodiments, the gate coupled to each row of pixel units is between the two rows of sub-pixels in the row of pixel units.

In some embodiments, for the two rows of sub-pixels in each row of pixel units, the gates of the switching transistors of the sub-pixels in one row are coupled to the gate line through first gate connection lines, the gates of the switching transistors of the sub-pixels in the other row are coupled to the gate line through second gate connection lines; the first gate connection lines are provided in the same layer and has the same material as the gate line, and the second gate connection lines are provided in the same layer and has the same material as the data line; a first insulation layer is provided between the layer where the gate line is located and the layer where the data line is located, and the second gate connection lines are coupled to the gate line through a via penetrating the first insulation layer.

In some embodiments, the data lines coupled to each column of pixel units are located between the two columns of sub-pixels in the column of pixel units.

In some embodiments, drains of the drive transistors of the pixel circuits in each column of pixel units are coupled to a first power line, and the first power line is located between the two columns of sub-pixels in the pixel units corresponding to the first power line.

In some embodiments, the first power line includes a first sub-power line and a second sub-power line that are electrically coupled to each other; the first sub-power line is provided in the same layer and has the same material as the gate line; the second sub-power line is provided in the same layer and has the same material as the data line.

In some embodiments, the display substrate further includes a plurality of control signal lines, and the gates of the sensing transistors of the pixel units located in a same row are coupled to a same control signal line.

In some embodiments, the control signal line coupled to each row of pixel units is located between the two rows of sub-pixels of the row of pixel units.

In some embodiments, the control signal line is provided in the same layer and has the same material as the gate line; for the two rows of sub-pixels in each row of pixel units, the gates of the sensing transistors of the sub-pixels in one row are coupled to the control signal line through first control signal connection lines, the gates of the sensing transistors of the sub-pixels in the other row are coupled to the control signal line through second control signal connection lines; the first control signal connection line is provided in the same layer and has the same material as the control signal line, and the second control signal connection line is provided in the same layer and has the same material as the data line; a first insulation layer is further provided between the layer where the gate line is located and the layer where the data line is located, and the second control signal connection line is coupled to the control signal line through a via penetrating the first insulation layer.

In some embodiments, the display substrate further includes a plurality of sensing signal lines, and drains of the sensing transistors in the pixel units located in a same column are coupled to a same sensing line.

In some embodiments, the sensing lines are provided in a same layer and have a same material as the data lines.

In some embodiments, each of the pixel units includes sub-pixels arranged in two columns in the first direction and two rows in the second direction.

In some embodiments, colors of light emitted from organic electroluminescent diodes of the sub-pixels in each of the pixel units are red, green, blue, and white, respectively.

In some embodiments, the display substrate further includes a plurality of light-transmission units; the light-transmission units and the pixel units are provided alternately in the first direction or the second direction.

In some embodiments, the switching transistor, the drive transistor, and the sensing transistor each include a semiconductor active layer, a gate, and a source and a drain provided in a same layer, which are provided sequentially; a light shielding layer and a buffer layer are sequentially provided between the semiconductor active layer and the base substrate; a gate insulation layer is provided between a layer where the gate is located and the semiconductor active layer; an interlayer insulation layer is provided between the layer where the gate is located and the layer where the source and the drain are located.

In some embodiments, the storage capacitor includes a first electrode and a second electrode; the second electrode includes a first sub-electrode plate and a second sub-electrode plate; the first electrode is provided in the same layer and has a same material as the semiconductor active layer; the light shielding layer serves as the first sub-electrode plate; the second sub-electrode plate is provided in the same layer and has a same material as the source of the drive transistor; the first sub-electrode plate and the second sub-electrode plate are coupled to each other through a via penetrating the buffer layer, the gate insulation layer, the interlayer insulation layer.

In some embodiments, the gate of the drive transistor in the pixel circuit is coupled to the source of the switching transistor through a first trace; the source of the drive transistor is coupled to the source of the sensing transistor through a second trace;

the first trace and the second trace both are provided in the same layer and have a same material as the source of the drive transistor.

In some embodiments, the display substrate further includes a supplementary cathode; the supplementary cathode includes a first sub-structure and a second sub-structure sequentially provided on the base substrate; the first sub-structure is provided in the same layer and has the same material as the gate of the drive transistor, the second sub-structure is provided in the same layer and has the same material as the source of the drive transistor, and the first sub-structure and the second sub-structure are coupled to each other through a via penetrating the interlayer insulation layer.

In some embodiments, the supplementary cathode extends in the second direction, each column of sub-pixels are provided with one supplementary cathode on a side of the column of sub-pixels, and adjacent columns of supplementary cathodes are separated by one column of sub-pixels.

In some embodiments, a passivation layer, a connecting electrode, and a planarization layer are provided sequentially between the source and the drain of the drive transistor and a layer where an anode of the organic electroluminescent diode is located; the connecting electrode is coupled to the drain of the drive transistor through a via penetrating the passivation layer, and the anode of the organic electroluminescent diode is coupled to the connecting electrode through a via penetrating the planarization layer.

In some embodiments, the organic electroluminescent diode is a top-emission type of organic electroluminescent diode.

In a second aspect, an embodiment of the present disclosure provides a display device which includes the aforementioned display substrate.

DETAIL DESCRIPTION OF EMBODIMENTS

In order to enable those skilled in the art to better understand the technical solutions of the present disclosure, the present disclosure will be further described in detail below with reference to the accompanying drawings and specific implementations.

Unless otherwise defined, the technical or scientific terms used in the present disclosure shall have the usual meanings understood by those with ordinary skills in the field to which this disclosure belongs. Words "first", "second" and the like used in the present disclosure do not indicate any order, quantity or importance, but are only used to distinguish different components. Similarly, words "a", "one" or "the" or the like do not mean quantity limitation, but mean that there is at least one. Words "comprising", "including" and the like mean that the element or item appearing before the word encompasses the element or item listed after the word and its equivalents, but does not exclude other elements or items. Words "connected", "coupled" and the like are not limited to physical or mechanical connections, but may include electrical connections, whether direct or indirect. Words "up", "down", "left", "right", etc. are only used to indicate the relative position relationship, and when the absolute position of the described object changes, the relative position relationship may also change accordingly.

Figure 1:
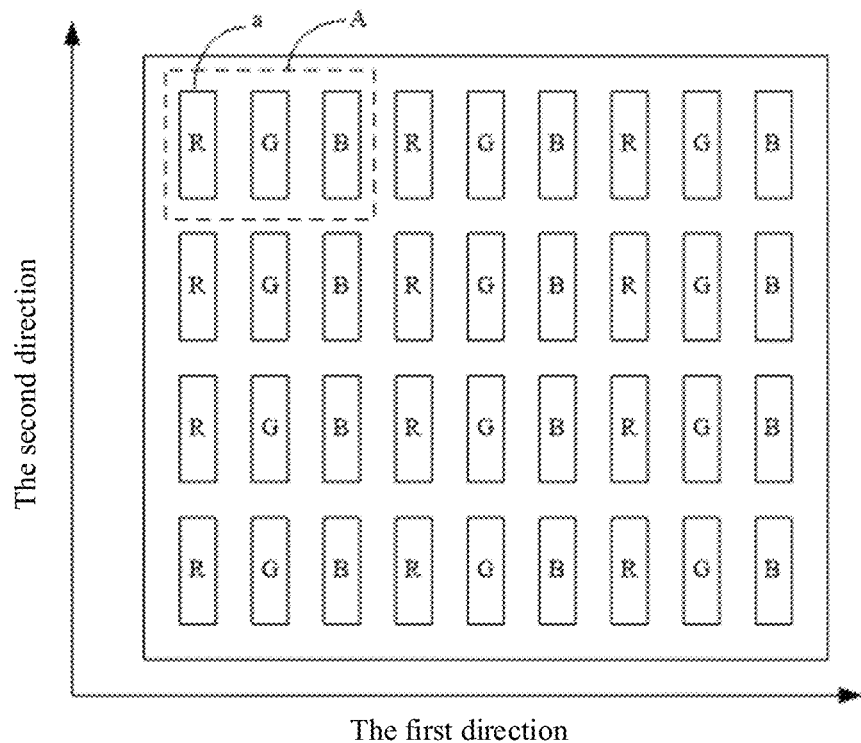
FIG. 1 is an exemplary pixel arrangement diagram of a display substrate.

FIG. 1 shows a structure of a display substrate. The display substrate includes a base substrate 10, and a plurality of gate lines 1, plurality of data lines 7, plurality of control signal lines 13, plurality of sensing lines 2, and plurality of pixel units A provided on the base substrate 10; the gate lines 1 and the control signal lines 13 extend in a first direction, the data lines 7 and the sensing lines 2 extend in a second direction, and the first direction intersects the second direction, that is, the gate lines 1 and the data lines 7 are arranged to intersect each other. Each pixel unit A includes a plurality of sub-pixels 'a' located at intersections of the gate lines 1 and the data lines 7. In FIG. 1, each pixel unit A includes a red sub-pixel R, a green sub-pixel G, and a blue sub-pixel B. Each sub-pixel 'a' is provided with a pixel circuit therein.

Figure 2:
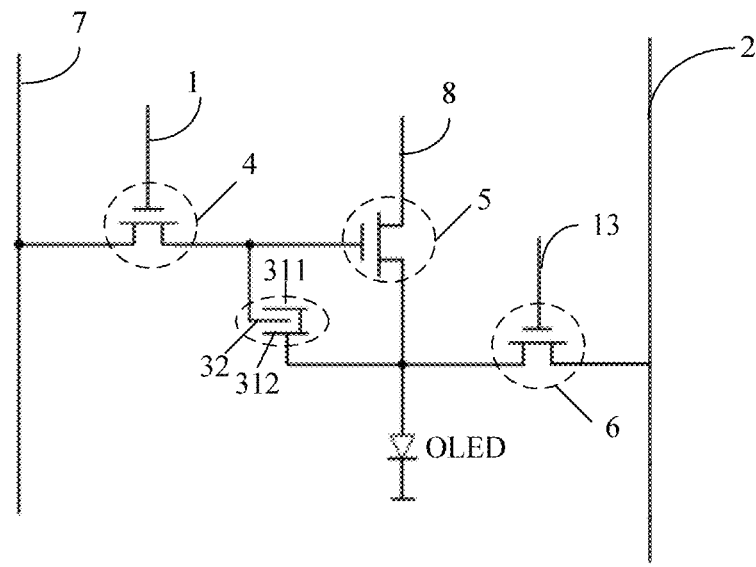
FIG. 2 is an exemplary pixel circuit diagram.

FIG. 2 is an exemplary pixel circuit. The pixel circuit includes a switching transistor 4, a drive transistor 5, a sensing transistor 6, a storage capacitor 3, and an organic electroluminescent diode OLED; a gate 42 of the switching transistor 4 is connected to the gate line 1, a source 42 of the switching transistor 4 is connected to a gate 52 of the drive transistor 5, and a drain 43 of the switching transistor 4 is connected to the data line 7; the gate 52 of the drive transistor 5 is connected to a first electrode of the storage capacitor 3, the source 53 of the drive transistor 5 is connected to a second electrode 32 of the storage capacitor 3, a source 63 of the sensing transistor 6 and an anode 401 of the organic electroluminescent diode OLED, a drain 54 of the driving transistor 5 is connected to a first power line 8; a gate 62 of the sensing transistor is connected to the control signal line 13, a drain 64 of the sensing transistor 6 is connected to a sensing signal; a cathode 403 of the organic electroluminescent diode OLED is connected to a second power line (or ground).

When only an external compensation is required for the pixel circuit, the pixel circuit includes at least the following two stages in the operation process: a display stage (including a data-voltage-Vdata-writing process) and a sensing stage (including a current-reading process).

In the display stage: a high-level signal is written to the gate line 1, the switching transistor 4 is turned on, the data voltage Vdata in the data line 7 is written to the gate of the drive transistor, and the storage capacitor 3 is charged, and the organic electroluminescent diode OLED is driven by the drive transistor 5 to emit light.

In the sensing stage: high-level signals are written to the gate line 1 and the signal control line, the sensing transistor and the drive transistor are turned on, a test voltage Vsense is written to the gate of the drive transistor through the data line 7, and the sensing transistor 6 reads the electric signal at the source 53 of the drive transistor 5 and outputs it through sensing, so that the external compensation circuit compensates for the mobility of the drive transistor 5 by using the output electrical signal.

Generally, the gate line 1 and the signal control line are arranged in parallel, and they are located on the upper and lower sides of the sub-pixel 'a'. The switching transistor 4 is located at the intersection of the gate line 1 and the data line 7 to facilitate the connection between the gate 42 of the switching transistor 4 and the gate line 1, and the connected between the drain of the switching transistor 4 and the data line 7; the sensing transistor 6 is located at the intersection of the control signal line 13 and the sensing line 2; the drive transistor 5 and the switching transistor 4 are arranged side by side in the first direction (the extending direction of the gate line 1), and the storage capacitor 3 is located in the middle region of the sub-pixel 'a'.

The inventor found that, since the source 63 of the sensing transistor 6 is connected to the source 53 of the drive transistor 5, there is a storage capacitor 3 between the drive transistor 5 and the sensing transistor 6, which results in an inconvenient connection between the source 63 of the sensing transistor 6 and the source 53 of the drive transistor 5. In order to solve the aforementioned problem, the following technical solutions are provided in the embodiments of the present disclosure.

It should be noted that, in the embodiments of the present disclosure, description is made by taking an example that the first direction and the second direction are perpendicular to each other. In this case, the first direction is the row direction, and the second direction is the column direction. Of course, it will be appreciated that the perpendicularity of the first direction and the second direction does not constitute a limitation to the embodiments of the present disclosure, as long as the first direction and the second direction intersect each other. Accordingly, when the first direction is perpendicular to the second direction, in the embodiments of the present disclosure, description is made by taking an example that the pixel units A are arranged in an array. Of course, the pixel units A may also be arranged according to a certain rule.

Figure 3:
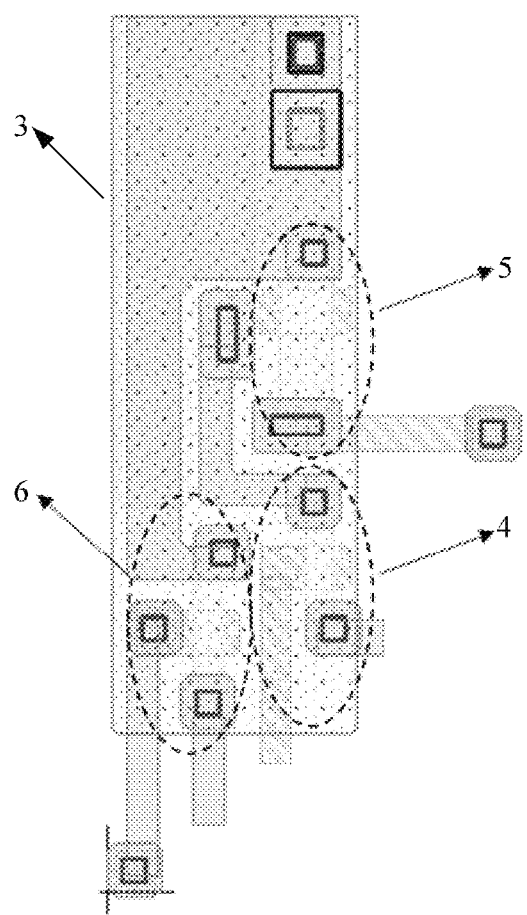
FIG. 3 is a pixel layout of a sub-pixel of a display substrate according to an embodiment of the present disclosure.

In a first aspect, as shown in FIG. 3, an embodiment of the present disclosure provides a display substrate. The display substrate includes a base substrate 10, and a plurality of rows of gate lines 1, a plurality of columns of data lines 7 and a plurality of pixel units A arranged in an array on the base substrate 10. Each pixel unit A includes a plurality of sub-pixels 'a', and each sub-pixel 'a' includes a pixel circuit; the pixel circuit includes at least a switching transistor 4, a drive transistor 5, a sensing transistor 6, and a storage capacitor 3 (for example, the pixel circuit as shown in FIG. 2); for each pixel circuit, the switching transistor 4, the drive transistor 5 and the sensing transistor 6 are all located on a same side of the storage capacitor 3; the switching transistor 4 is located on an intersection of the gate line 1 and the data line 7 to which the switching transistor 4 is connected, and the switching transistor 4 is provided adjacent to the sensing transistor 6 in the row direction, and adjacent to the drive transistor 5 in the column direction.

In the embodiment of the present disclosure, the switching transistor 4, the drive transistor 5, the sensing transistor 6, and the storage capacitor 3 in the pixel circuit of each sub-pixel 'a' are properly arranged such that the switching transistor, the drive transistor 5 and the sensing transistor 6 in each pixel circuit 4 are all located on the same side of the storage capacitor 3, and the switching transistor 4 is provided adjacent to the sensing transistor 6 in the row direction and adjacent to the drive transistor 5 in the column direction. Therefore, the row-direction space of each sub-pixel 'a' can be effectively used, which saves the column-direction space of each sub-pixel 'a', and effectively reduces the space occupied by each sub-pixel 'a', thereby ensuring that the resolution of the display panel to which the display substrate of the embodiment of the present disclosure is applied is greatly improved within a case where the layout space of the pixel-circuit is limited. Meanwhile, in the related art, there are non-light emitting regions of thin film transistors on both sides of the storage capacitor 3 in each sub-pixel 'a' (for example, the switching transistor 4 and the sensing transistor 6 are located on opposite sides of the storage capacitor 3), and thus a optical grating effect occurs, resulting in undesirable effects such as display ghosting. In contrast, in the embodiment of the present disclosure, the thin film transistors (the switching transistor 4, the drive transistor 5, and the sensing transistor 6) in each sub-pixel 'a' are collectively arranged, that is, arranged on the same side of the storage capacitor 3, which effectively solves the problem of the optical grating effect in the related art.

In some embodiments, each pixel unit A includes two rows of sub-pixels 'a', and the pixel circuits in the two rows of sub-pixels 'a' are controlled by a same gate line 1. The pixel circuits located in a same column of sub-pixels 'a' and having organic electroluminescent diodes OLED emitting light with a same color are provided with a data voltage signal through a same data line 7.

In other words, for each row of pixel units A, the gates 42 of the switching transistors 4 in the pixel circuits are connected to the same gate line 1. For each column of pixel units A, the drains 43 of the switching transistors 4 in the pixel circuits having the organic electroluminescent diodes OLED emitting light with the same color are connected to the same data line 7.

Specifically, if each pixel unit A includes four sub-pixels 'a' arranged in two rows and two columns, and the colors of light emitted from the organic electroluminescent diodes OLED in the pixel circuits in the four sub-pixels 'a' are all different. In this case, the gates 42 of the switching transistors 4 of the pixel circuits in the four sub-pixels 'a' of each of the pixel units A in the same row are connected to a same gate line 1, and the drains 43 of the switching transistors 4 of the pixel circuits in the four sub-pixels 'a' of each of the pixel units A in the same column are connected to corresponding data lines 7, respectively, that is to say, the four sub-pixels 'a' of each of the pixel units A in one row are controlled by one gate line 1, and the four sub-pixels 'a' of each of the pixel units A in one column are provided with data voltage signals by four data lines 7.

In the embodiment of the present disclosure, since the plurality of sub-pixels 'a' of each of the pixel units A in a same row are controlled by one gate line 1, a plurality of sub-pixels 'a' can be scanned when a scanning signal is input to this gate line 1, which can greatly improve the refresh frequency of the display panel to which the embodiment of the present disclosure is applied.

In some embodiments, when each pixel unit A includes two rows of sub-pixels 'a', the gate line 1 for controlling the two rows of sub-pixels 'a' of the pixel unit A is located between the two rows of sub-pixels 'a'. In this way, the connection of the gates 42 of the switching transistors 4 of the pixel circuits in the two rows of sub-pixels 'a' to the gate line 1 is facilitated, and the gates 42 of the switching transistors 4 and the gate line 1 connected thereto can be prepared in a single process during preparation to form an integrated structure, so that the preparation process is simple and easy to implement.

Figure 12:
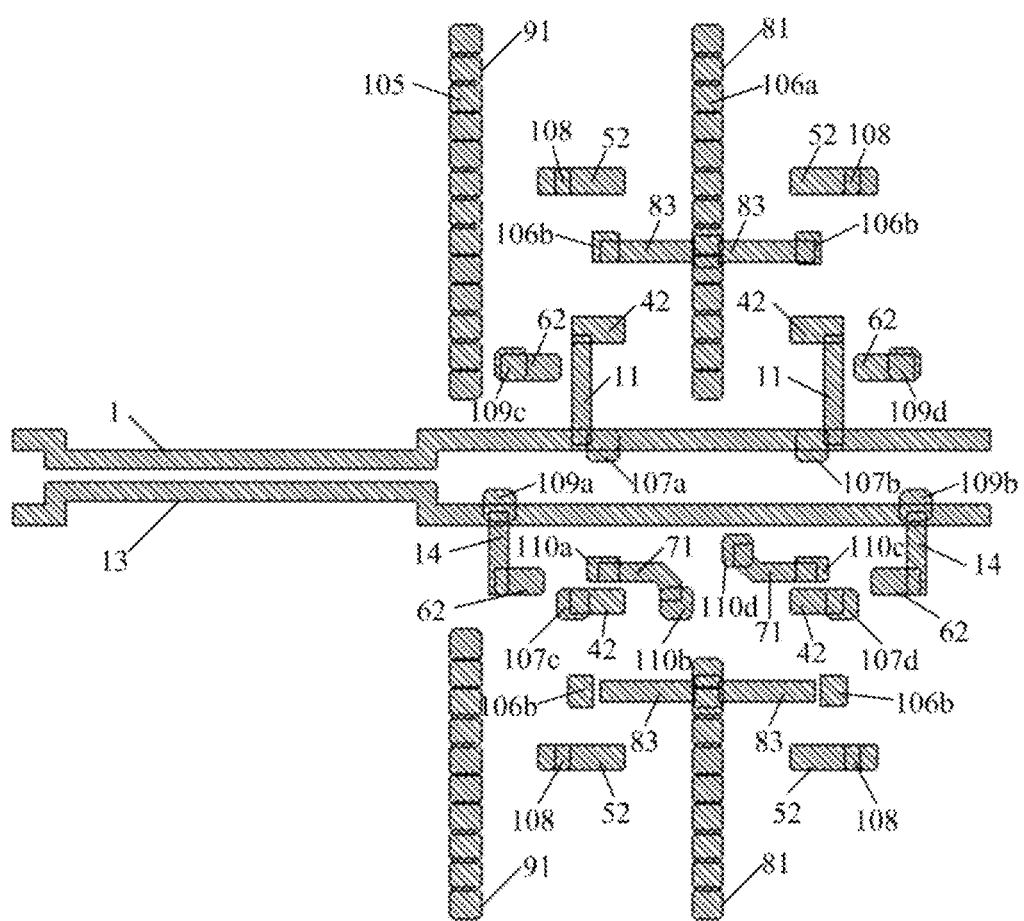
FIG. 12 is a layout of a layer where a gate in FIG. 9 is located.
Figure 13:
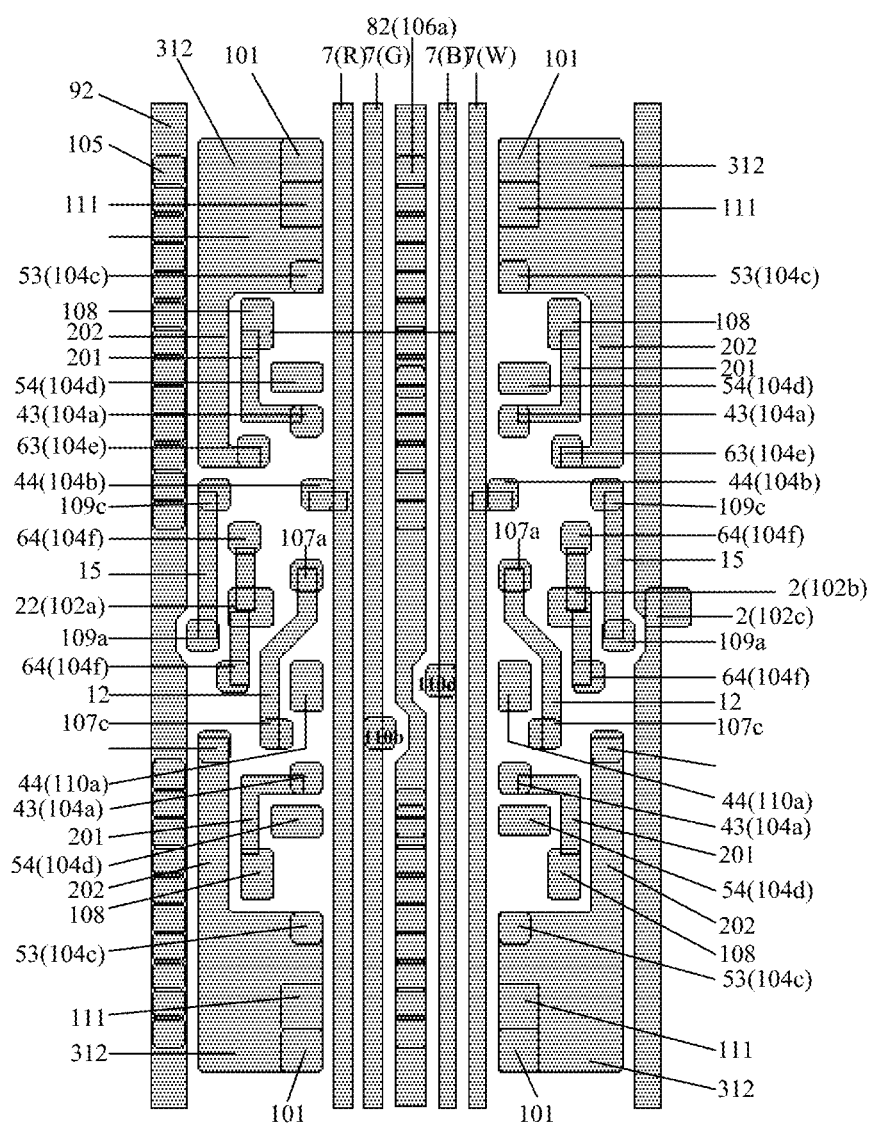
FIG. 13 is a layout of a layer where a source and a drain in FIG. 9 are located.

In some embodiments, as shown in FIGS. 12 and 13, for the two sub-pixels 'a' in each row of pixel units A, the gates 42 of the switching transistors 4 of the sub-pixels 'a' in one row are connected to the gate line 1 through first gate connection lines 11, the gates 42 of the switching transistors 4 of the sub-pixels 'a' in the other row are connected to the gate line 1 through second gate connection lines 12; the first gate connection line 11 is provided in the same layer and has the same material as the gate line 1, and the second gate connection line 12 is provided in the same layer and has the same material as the data line 7; a first insulation layer is provided between the layer where the gate line 1 is located and the layer where the data line 7 is located, and the second gate connection line 12 is connected to the gate line 1 through a via penetrating the first insulation layer.

It should be noted here that, in the embodiments of the present disclosure, description is made by taking an example that the switching transistor 4, the drive transistor 5, and the sensing transistor 6 are all top-gate thin film transistors. Respective film layers of the switching transistor 4, the drive transistor 5, and the sensing transistor 6 are provided in the same layer. Taking the drive transistor 5 as an example, it includes a semiconductor active layer 51, a gate insulation layer 302, a gate 52, an interlayer insulation layer 303, a source electrode 53 and a drain electrode 54 sequentially provided on the base substrate 10. The above-mentioned gate line 1 is usually provided in the same layer as the gate 52 of the drive transistor 5, and the data line 7 is usually provided in the same layer as the source 53 and the drain 54 of the drive transistor 5. Therefore, the first insulation layer between the layers where the above-mentioned gate 1 and data line 7 are located refers to a two-layer structure of the gate insulation layer 302 and the interlayer insulation layer 303, and the via penetrating the first insulation layer is a combined via composed of a via penetrating the gate insulation layer 302 and a via penetrating the interlayer insulation layer.

In some embodiments, when each pixel unit A includes two columns of sub-pixels 'a', the data lines 7 for providing data voltage signals for the two columns of sub-pixels 'a' of the pixel unit A are located between the two columns of sub-pixels 'a'. In this way, the connection of the drains 43 of the switching transistors 4 of the two columns of sub-pixels 'a' is facilitated, and the drains 43 of the switching transistors 4 and the data lines 7 can be prepared by a single process during preparation, and the drains of the switching transistors 4 and the data lines 7 connected thereto can be prepared into an integrated structure, so that the preparation process is simple and easy to implement.

In some embodiments, the drains 54 of the drive transistors 5 of the pixel circuits of the sub-pixels 'a' in each column of pixel units A are connected to the first power line 8, and when each pixel unit A includes two columns of sub-pixels 'a', the first power line 8 is located between the two columns of sub-pixels 'a' of the pixel unit A corresponding to it. The reason for such arrangement is that the drive transistor 5 and the switching transistor 4 are arranged side by side in the column direction, and the connection between the first power line 8 and the drain 54 of the drive transistor 5 will be more convenient with the arrangement.

Further, the first power line 8 may include a first sub-power line 81 and a second sub-power line 82 electrically connected to each other; the first sub-power line is provided in the same layer and has the same material as the gate line 1; the second sub-power line 82 is provided in the same layer and has the same material as the data line 7, and the data line 7 is usually provided in the same layer and has the same material as the drain 54 of the drive transistor 5. Therefore, the second sub-power line 82 can be provided in the same layer and has the same material as the drain 54 of the drive transistor 5, and thus the first power line 8 and the drain 54 of the drive transistor 5 can be prepared by a single patterning process, so that the preparation process is simple and easy to implement.

In some embodiments, when each pixel unit A includes two columns of sub-pixels 'a', the first power line 8 and the data lines 7 corresponding to each column of pixel units A are all located between the two columns of sub-pixels 'a'. In this case, the extending directions of the first power line 8 and the data lines 7 may be set to be parallel, so that the wiring space of the first power line 8 and the data lines 7 can be reduced, and the pixel resolution can be improved.

In some embodiments, the gate 62 of the sensing transistor 6 of each pixel circuit is connected to the control signal line 13 corresponding thereto. In the embodiment of the present disclosure, the gates 62 of the sensing transistors 6 of the pixel circuits of the pixel units A in the same row may be connected to the same control signal line 13. In some embodiments, when each pixel unit A includes two rows of sub-pixels 'a', the control signal line 13 for controlling the row of pixel units A is located between the two rows of sub-pixels 'a'. Further, the control signal line 13 may also be set parallel to the extending direction of the gate line 1. In this way, when a gate line 1 is located between the two rows of sub-pixels 'a' connected to the gate line 1, the wiring space of the gate line 1 and the control signal line 13 can be reduced, and the pixel resolution is improved. In addition, the gate line 1 and the control signal line 13 can be provided in the same layer and have the same material. In this way, the gate line 1 and the control signal line 13 can be prepared by a single patterning process, which can simplify the process steps and reduce the process cost.

In some embodiments, the control signal line 13 and the gate line 1 are provided in the same layer and have the same material; for the two rows of sub-pixels 'a' of each row of pixel units A, the gates 62 of the sensing transistors 6 of the sub-pixels 'a' in one row are connected to the control signal line 13 through first control signal connection lines 14, and the gates 62 of the sensing transistors 6 of the sub-pixels 'a' in the other row are connected to the control signal line 13 through second control signal connection lines 15; the first control signal connection line 14 is provided in the same layer and has the same material as the control signal line 13, the second control signal connection line 15 is provided in the same layer and has the same material as the data line 7; a first insulation layer is provided between the layer where the gate line 1 is located and the layer where the data line 7 is located, and the second control signal connection line is connected to the control signal line through a via penetrating the first insulation layer.

It should be noted here that, the description for this first insulation layer is the same as the above-mentioned first insulation layer, and will not be repeated here. For each row of pixel units A, if the gates 42 of the switching transistors 4 in the first row of sub-pixels 'a' are connected to the gate line 1 through the first gate connection lines 12, then the gates 62 of the sensing transistors 6 in the second row of sub-pixels 'a' are connected to the control signal line 13 through the first control signal connection lines 14. In this way, the problem of intersection of the connection lines caused by the arrangement of the gate line 1 and the control signal line 13 in the same layer is avoided.

In the embodiments of the present disclosure, for each row of pixel units A, the gate line 1 and the control signal line 13 that are connected thereto, and the switching transistors 4, the drive transistors 5 and the sensing transistors 6 in the sub-pixels 'a' in each pixel unit A are collectively arranged (located in a region between the two rows of sub-pixels 'a'), which reduces the area of the display region of the display panel and increases the area of the transparent region, thereby eliminating the optical grating effect.

In some embodiments, the display substrate further includes plurality of sensing signal lines, and the drains 64 of the sensing transistors 6 of the pixel circuits of the pixel units A in the same column are connected to the same sensing line 2.

Further, each sensing line 2 is located on a same side of the pixel unit A corresponding to it, that is, adjacent sensing lines 2 are separated by a column of pixel units A. In this way, the inaccuracy of the transmitted electrical signals caused by signal coupling between the sensing lines 2 due to the collective arrangement of the sensing lines 2 can be avoided.

In some embodiments, each pixel unit A adopts four sub-pixels 'a' arranged in a square form, that is, each pixel unit A includes four sub-pixels 'a' in two rows and two columns. In this case, the four sub-pixels 'a' in one pixel unit A share one gate line 1. If the colors of light emitted from the four organic electroluminescent diodes OLED in the four sub-pixels 'a' are different, the four sub-pixels 'a' are connected to four data lines 7, respectively. In this case, the gate line 1, the data line 7, the control signal line 13, the first power line 8, and the sensing line 2 of the display substrate can all adopt any of the above-mentioned arrangements. The description will not be repeated here.

Figure 4:
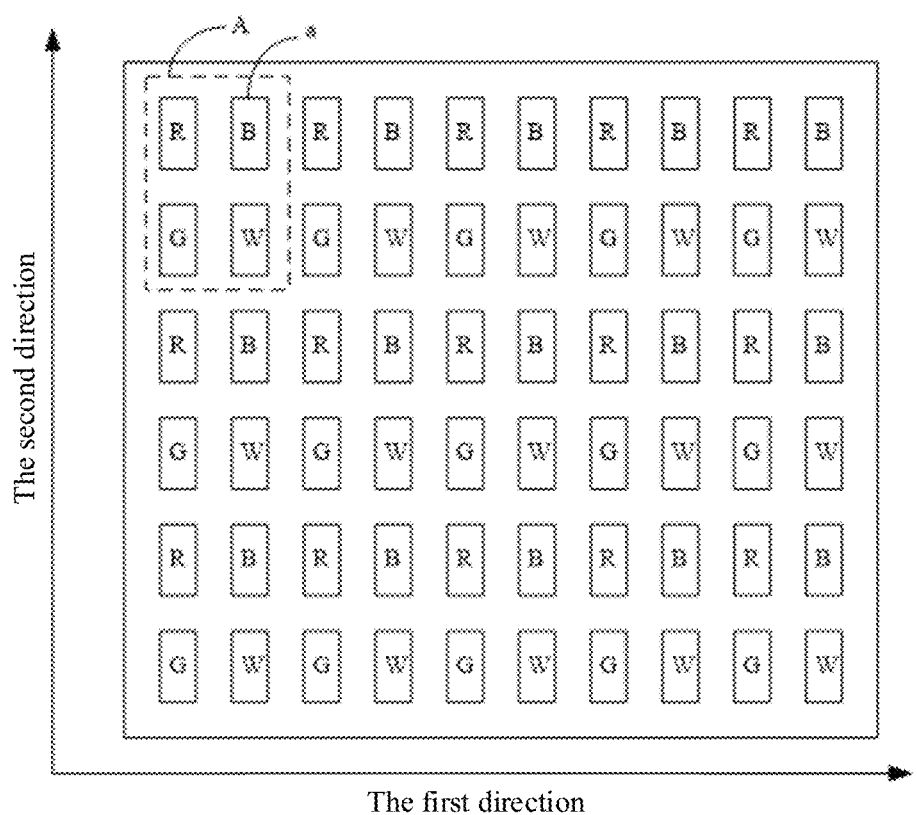
FIG. 4 is a schematic diagram illustrating an arrangement of pixels of a display substrate according to an embodiment of the present disclosure.
Figure 5:
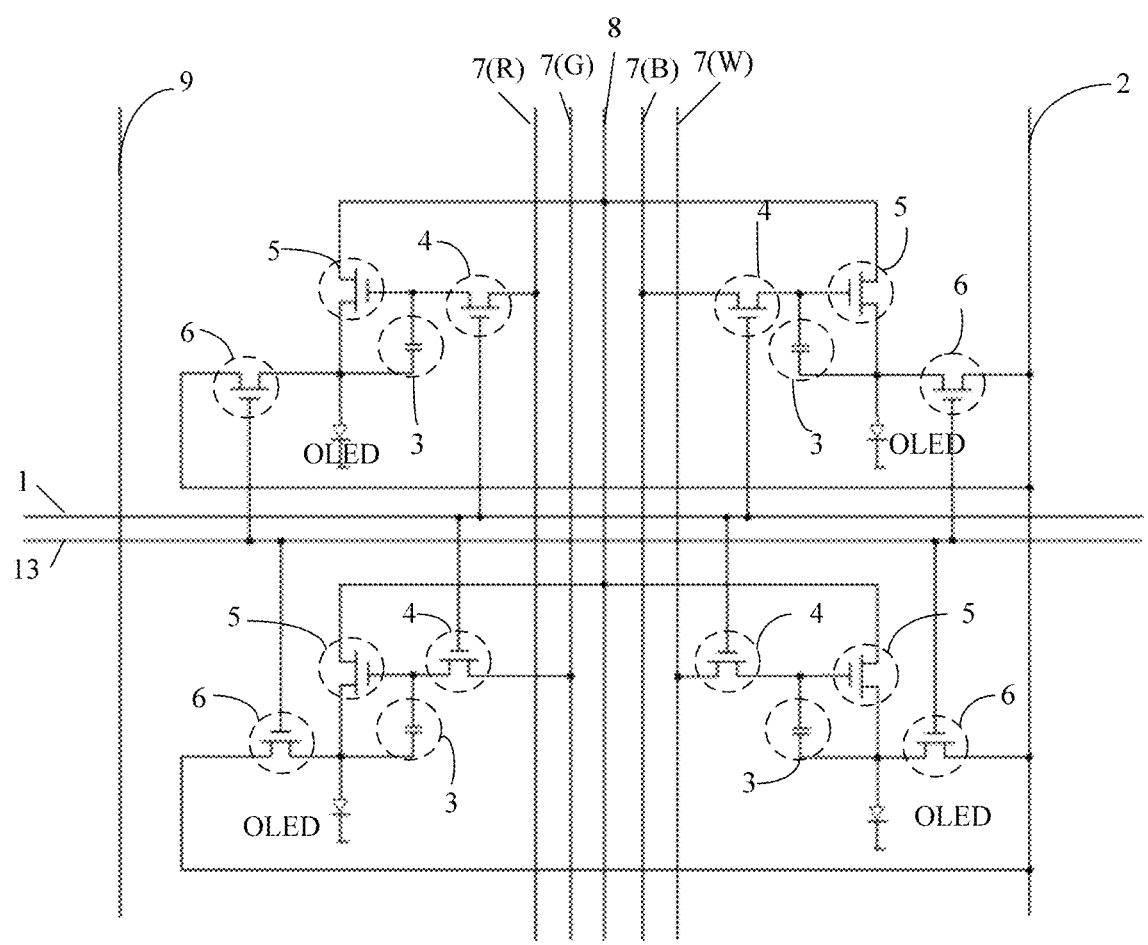
FIG. 5 is a schematic diagram of a pixel circuit of a pixel unit according to an embodiment of the present disclosure.

In some embodiments, the colors of light emitted from the organic electroluminescent diodes OLED of the sub-pixels 'a' in each pixel unit A are red (R), green (G), blue (B), and white (W), respectively, that is, each pixel unit A includes a red sub-pixel R, a green sub-pixel G, a blue sub-pixel B, a white sub-pixel W, the data lines correspondingly connected to the four sub-pixels respectively are denoted by 7(R), 7(G), 7(B), 7(W). As shown in FIGS. 4 and 5, in the embodiments of the present disclosure, description is made by taking an example that, in each pixel unit A, the colors of light emitted from the organic electroluminescent diodes OLED of the first row of sub-pixels 'a' are red and blue, and the colors of light emitted from the organic electroluminescent diodes OLED of the second row of sub-pixels 'a' are green and white. Of course, each pixel unit A is not limited to including only four sub-pixels 'a'. For example, each pixel unit A includes three sub-pixels 'a', for example, sub-pixels 'a' of three colors of red, green and blue, which may be arranged in a triangular shape.

Figure 6:
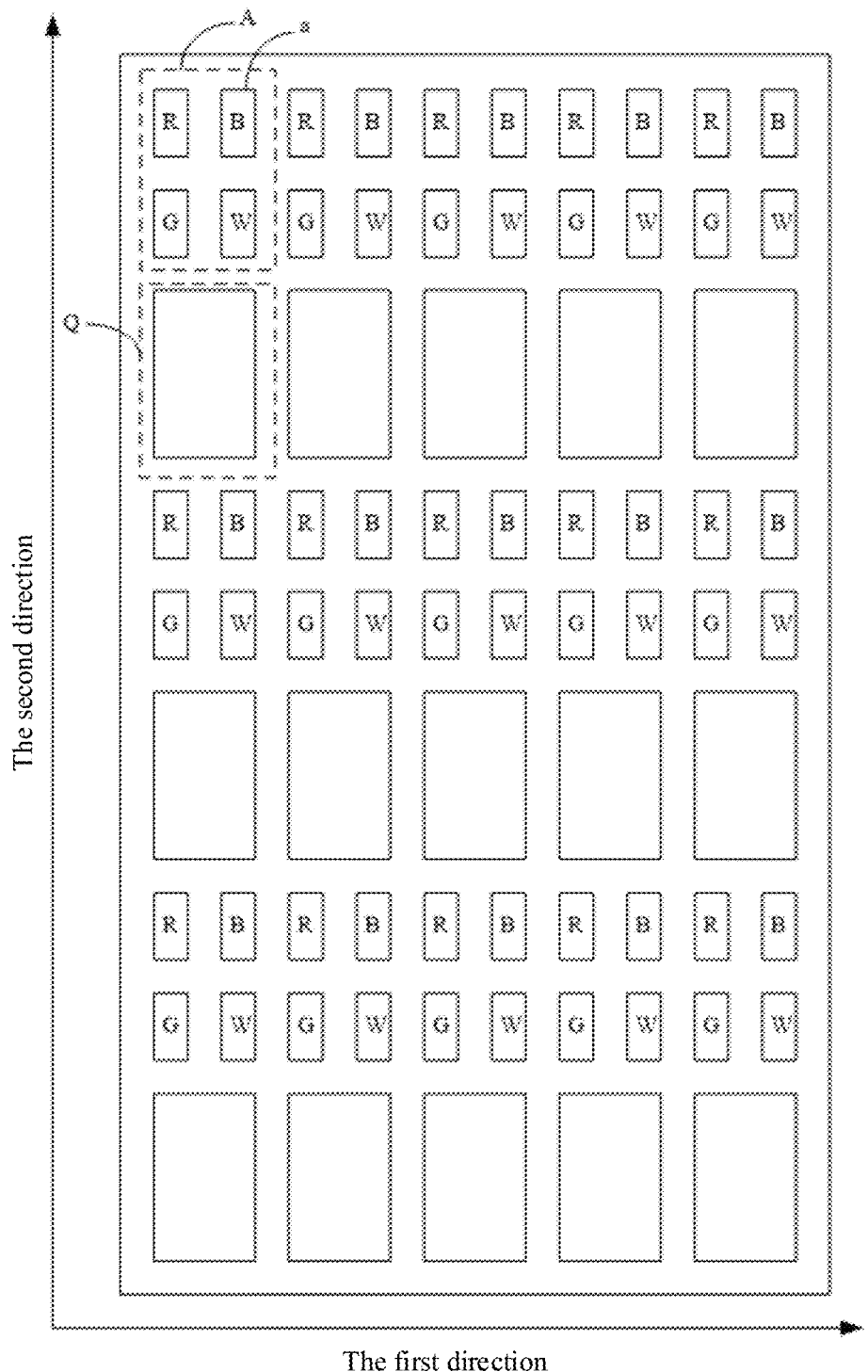
FIG. 6 is a schematic diagram illustrating another arrangement of pixels of a display substrate according to an embodiment of the present disclosure.

As shown in FIG. 6, the display substrate in the embodiments of the present disclosure can be applied to a transparent display. In this case, the display substrate not only includes the above structure, but also includes light-transmission units Q. The light-transmission units Q and the pixel units A are provided alternately in the row direction or the column direction. The pixel unit A performs display according to an image to be displayed, and the light-transmission unit Q, as its name implies, can transmit light at the position where the light-transmitting unit Q is located, and when viewing the display panel to which the display substrate is applied, the viewer can see the scene behind the display panel (the side facing away from the display surface) through the light-transmission unit Q.

It should be noted here that, each sub-pixel 'a' acquires a scanning signal through the gate line 1 electrically connected thereto and acquires a data voltage signal through the data line 7. Under the action of the scanning signal and the data voltage signal, the organic electroluminescent diodes OLED in the sub-pixel 'a' emit light. In each column of sub-pixels 'a', the sub-pixels 'a' in which the organic electroluminescent diodes OLED emit light with the same color are connected to the same data line 7, which passes through the light-transmission unit Q and needs to be shielded by a black matrix (not shown in the figure).

In some embodiments, the switching transistor 4, the drive transistor 5, and the sensing transistor 6 in the display substrate all include a semiconductor active layer, a gate, and a source and a drain in a same layer, which are provided sequentially; a light shielding layer and a buffer layer 301 are provided sequentially between the semiconductor active layer and the base substrate 10; a gate insulation layer 302 is provided between the layer where the gate is located and the semiconductor active layer; an interlayer insulation layer 303 is provided between the layer where the gate is located and the layer where the source and the drain are located.

The switching transistor 4, the drive transistor 5, and the sensing transistor 6 in the embodiments of the present disclosure may all be oxide thin film transistors, or may be polysilicon or amorphous silicon thin film transistors. In the embodiments of the present disclosure, description is made by taking an example that the transistors are all oxide transistors. The switching transistor 4, the drive transistor 5, and the sensing transistor 6 may all be top-gate transistors or bottom-gate transistors. In the following, description is made by taking an example that the transistors in the embodiments of the present disclosure are all top-gate transistors. Since the switching transistor 4, the drive transistor 5, and the sensing transistor 6 all include the semiconductor active layer, the gate, and the source and the drain provided in the same layer, which are provided sequentially, the film layers on the display substrate are described with reference to the layer structures of the drive transistor 5 and the organic electroluminescent diode OLED.

In one example, since the drive transistor 5 is a top-gate oxide thin film transistor, in order to prevent light from affecting the electron mobility of the semiconductor active layer, a light shielding layer and a buffer layer 301 are sequentially formed on the base substrate 10 before forming the transistor. The drive transistor 5 may be a top-gate type, and may include a semiconductor active layer, a gate insulation layer 302, a gate, an interlayer insulation layer 303, a source, and a drain sequentially provided on a side of the base substrate 10 away from the buffer layer 301. The source and the drain are located on two opposite sides of the gate, and may respectively contact a source contact region and a drain contact region on two opposite sides of the active layer through vias (for example, metal vias), respectively. It will be appreciated that the drive transistor 5 may also be a bottom-gate type.

The storage capacitor 3 includes a first electrode and a second electrode 32; the second electrode 32 includes a first sub-electrode plate 311 and a second sub-electrode plate 312; orthographic projections of the first electrode, the first sub-electrode plate 311 and the second sub-electrode plate 312 on the base substrate 10 at least partially overlap.

Specifically, the first electrode is provided in the same layer and has a same material as the semiconductor active layer; the first sub-electrode plate 311 is provided in the same layer and has a same material as the light shielding layer; the second sub-electrode plate 312 is provided in the same layer and has a same material as the source 53 of the drive transistor 5; the first sub-electrode plate 311 and the second sub-electrode plate 312 are connected to each other through a via penetrating the buffer layer 301, the gate insulation layer 302, the interlayer insulation layer 303. The first via includes a via penetrating the buffer layer 301, a via penetrating the gate insulation layer 302, and a via penetrating the interlayer insulation layer 303 which are combined together.

For example, the materials of the gate and the light shielding layer may include metal materials or alloy materials, such as molybdenum, aluminum, and titanium, and so on. The source and the drain may include metal materials or alloy materials, such as a metal single-layer or multi-layer structure formed of molybdenum, aluminum, and titanium, and so on. For example, the multi-layer structure is a multi-metal laminated layer, such as a laminated layer of titanium, aluminum, and titanium (Al/Ti/Al), etc. The material of the semiconductor active layer may include an oxide semiconductor material, such as indium gallium zinc oxide, indium gallium tin oxide, and the like.

Figure 7:
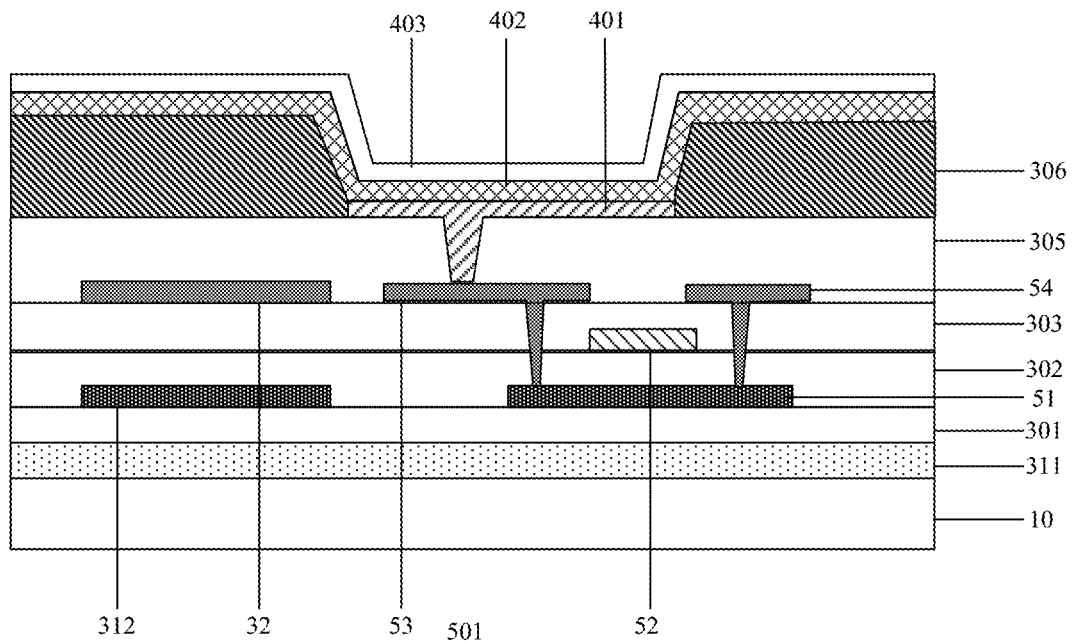
FIG. 7 is a cross-sectional view of a drive transistor and an organic electroluminescent diode of a display substrate according to an embodiment of the present disclosure.

As shown in FIG. 7, a planarization layer 304 is provided on the side of the drive transistor 5 away from the base substrate 10. The planarization layer 304 is usually made of an organic material, such as photoresist, acrylic-based polymer, silicon-based polymer, and the like.

As shown in FIG. 7, the organic electroluminescent diode OLED may include an anode 401 of the organic electroluminescent diode OLED and a pixel definition layer 306 sequentially formed on the planarization layer 304. It will be appreciated that the organic electroluminescent diode OLED may further include a light emitting layer 402 and a cathode 403.

As shown in FIG. 7, the anode (the first electrode) of the organic electroluminescent diode OLED may be electrically connected to the source 53 of the drive transistor 5 through a via penetrating the planarization layer 304. The anode may be made of ITO (Indium Tin Oxide) or Indium Zinc Oxide (IZO) or Zinc oxide (ZnO) or the like; the pixel definition layer 306 may cover the planarization layer 304. The pixel definition layer 306 may be made of an organic material, e.g., photoresist or another organic material, and the pixel definition layer 306 may have a receiving part exposing the first electrode; the light emitting layer is located in the receiving part and formed on the anode, and the light emitting layer may include a small molecular organic material or a polymer molecular organic material, which may be a fluorescent light-emitting material or a phosphorescent light-emitting material, and may emit red light, green light, blue light, or white light, etc.; in addition, according to different actual needs, in different examples, the light emitting layer may further include functional layers such as an electron injection layer, an electron transport layer, a hole injection layer, a hole transport layer, etc.; the cathode covers the light emitting layer. The cathode may be made of a metal material such as lithium (Li), aluminum (Al), magnesium (Mg), and silver (Ag).

It should be noted that, the anode 401, the light emitting layer 402, and the cathode 403 can constitute an organic electroluminescent diode OLED. The display substrate includes organic electroluminescent diodes OLED arranged in an array. In addition, it should be noted that the anodes 401 of the organic electroluminescence diodes OLED are independent of each other, and the cathodes 403 of the organic electroluminescence diodes OLED can be connected as an integrated plate; that is, the cathode is an integrated-plate structure provided on the display substrate, and is a common electrode for a plurality of organic electroluminescent diodes OLED.

Figure 8:
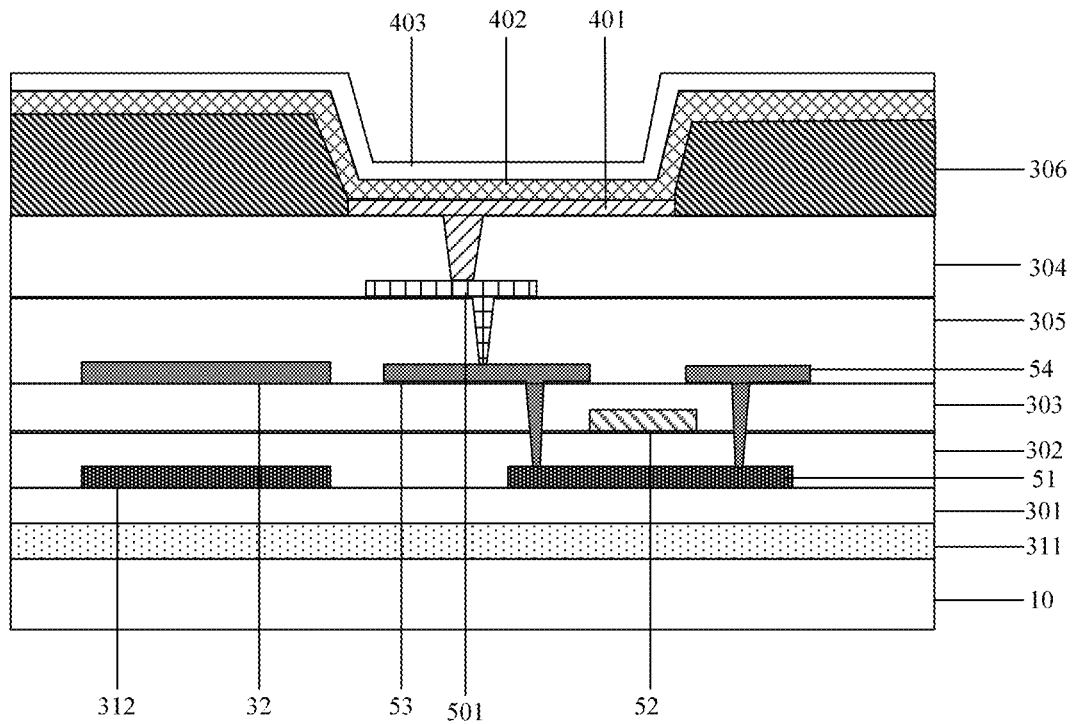
FIG. 8 is another cross-sectional view of a drive transistor and an organic electroluminescent diode of a display substrate according to an embodiment of the present disclosure.
Figure 9:
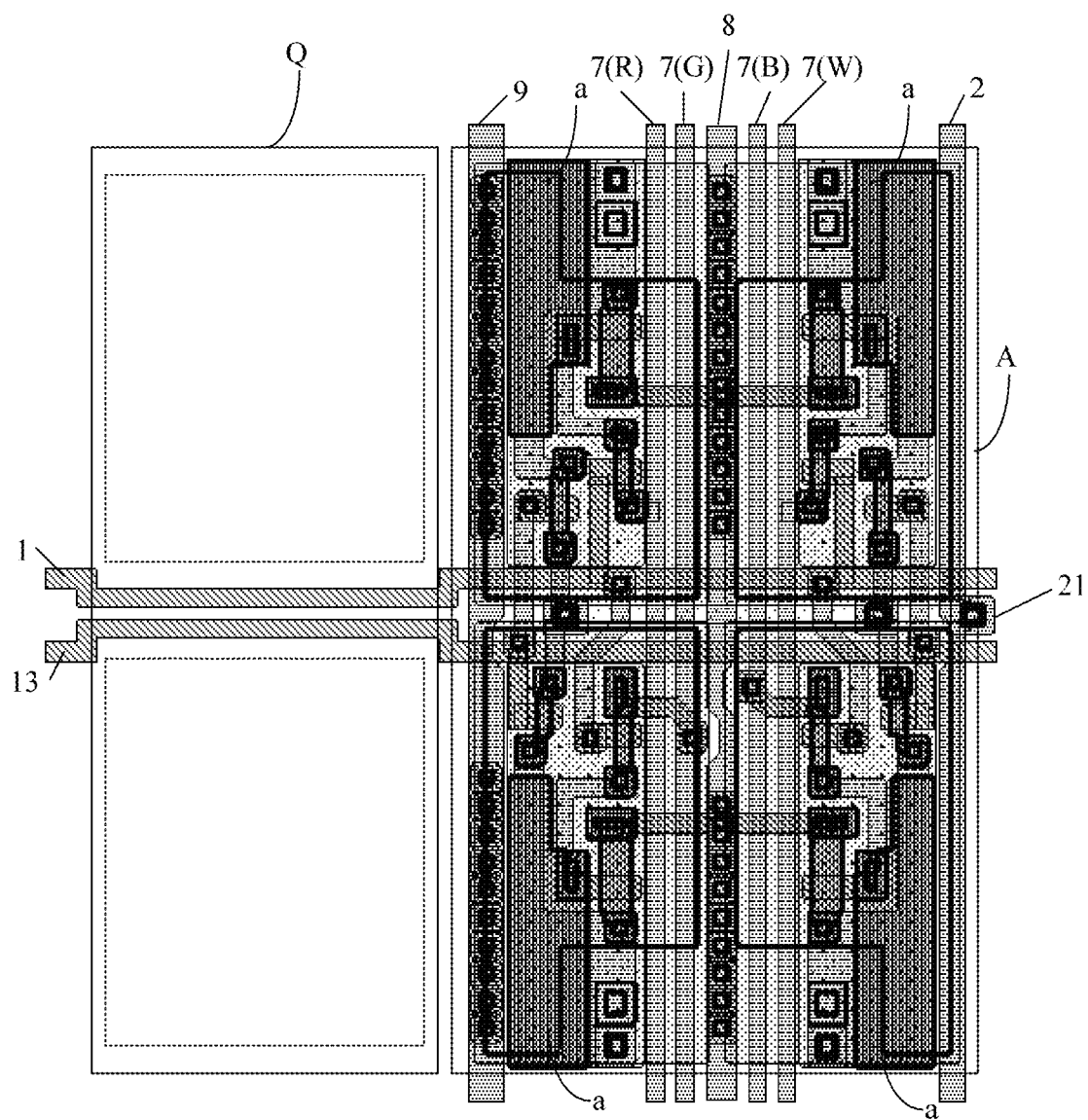
FIG. 9 is a layout of a pixel unit of a display substrate according to an embodiment of the present disclosure.

In some embodiments, as shown in FIG. 8, the anode 401 of the organic electroluminescent diode OLED may also be electrically connected to the source 53 of the drive transistor 5 through a connecting electrode 501. When the anode 401 is electrically connected to the drive transistor 5 through the connecting electrode 501, a passivation (PVX) layer may be formed between the planarization layer 304 and the layer where the source 53 and the drain of the drive transistor 5 are located. The passivation layer 305 may be formed of a material such as silicon oxide, silicon nitride, or silicon oxynitride; the passivation layer 305 covers the layer where the source and drain are located; and the connecting electrode 501 is formed between the planarization layer 304 and the passivation layer 305, and is connected electrically to the source 53 of the drive transistor 5 through a via (for example, a metal via) in the passivation layer 305; the first electrode may be connected electrically to the connecting electrode 501 through a via (for example, a metal via) in the planarization layer 304. In this way, the connection between the anode 401 of the organic electroluminescent diode OLED and the source 53 of the drive transistor 5 is achieved.

Of course, a structure such as an encapsulation layer may further be included on the organic electroluminescent diode OLED, and the encapsulation layer includes a first encapsulation layer, a second encapsulation layer, and a third encapsulation layer stacked in sequence. The first encapsulation layer and the third encapsulation layer are configured to prevent water and oxygen from entering the light emitting layer; the first encapsulation layer and the third encapsulation layer may be made of an inorganic material such as silicon nitride and silicon oxide. The second encapsulation layer is used to achieve planarization to facilitate the production of the third encapsulation film layer. The second encapsulation layer may be made of acrylic-based polymer, silicon-based polymer, and the like.

In some embodiments, the gate 52 of the drive transistor 5 and the source 42 of the switching transistor 4 in the pixel circuit are connected by a first trace 201; the source 53 of the drive transistor 5 and the source 63 of the sensing transistor 6 are connected by a second trace 202; the first trace 201 and the second trace 202 are provided in the same layer and have the same material as the source 53 of the drive transistor 5. Of course, the data line 7, the sensing line 2, the first power line 8 and other structures may also be provided on the same layer as the source 53 and the drain of the drive transistor 5. In this way, the formed display substrate can be made lighter and thinner.

In some embodiments, since the cathodes 403 of the plurality of organic electroluminescent diodes OLED in the display substrate are of an integrated-plate structure, the input signal for an organic electroluminescent diode OLED farther from the signal input terminal has a larger voltage drop (IR drop). Therefore, the display substrate in the embodiments of the present disclosure is further provided with a supplementary cathode 9; the supplementary cathode 9 includes a first sub-structure 91 and a second sub-structure 92 sequentially provided on the base substrate 10; the first sub-structure 91 is provided in the same layer and has the same material as the gate 52 of the drive transistor 5, and the second sub-structure 92 is provided in the same layer and has the same material as the source 53 of the drive transistor 5. The first sub-structure 91 and the second sub-structure 92 are connected to each other through a second via penetrating the interlayer. It should be noted here that, in order to facilitate the connection of the first sub-structure 91 and the second sub-structure 92, the number of the second vias is multiple, and the plurality of second vias are arranged in a column in the extension direction of the supplementary cathode 9.

The supplementary cathode 9 extends in the column direction, one supplementary cathode 9 is provided on a side of each column of sub-pixels 'a', and adjacent columns of supplementary cathodes 9 are separated by a column of sub-pixels 'a'.

In some embodiments, since a light shielding layer is provided on the base substrate 10 in the embodiments of the present disclosure, the organic electroluminescent diode OLED is a top-emission organic electroluminescent diode OLED.

In order to make the structure of the display substrate in the embodiments of the present disclosure clearer, the structure of the display substrate will be described in conjunction with the following method for preparing the display substrate. In addition, it should be noted that the following method is only an example structure of the display substrate, and does not constitute a limitation to the protection scope of the embodiments of the present disclosure. The pixel unit A in the display substrate includes four sub-pixels 'a' arranged in a square form, and the data lines corresponding to the four sub-pixels are denoted by 7(R), 7(G), 7(B) and 7(W), respectively. With reference to FIGS. 5 and 9-13, the method for preparing the display substrate according to the embodiments of the present disclosure includes the following steps S01 to S13.

In S01, the base substrate 10 is provided. The base substrate 10 is a transparent base substrate 10, such as a glass base substrate 10 or the like.

Figure 10:
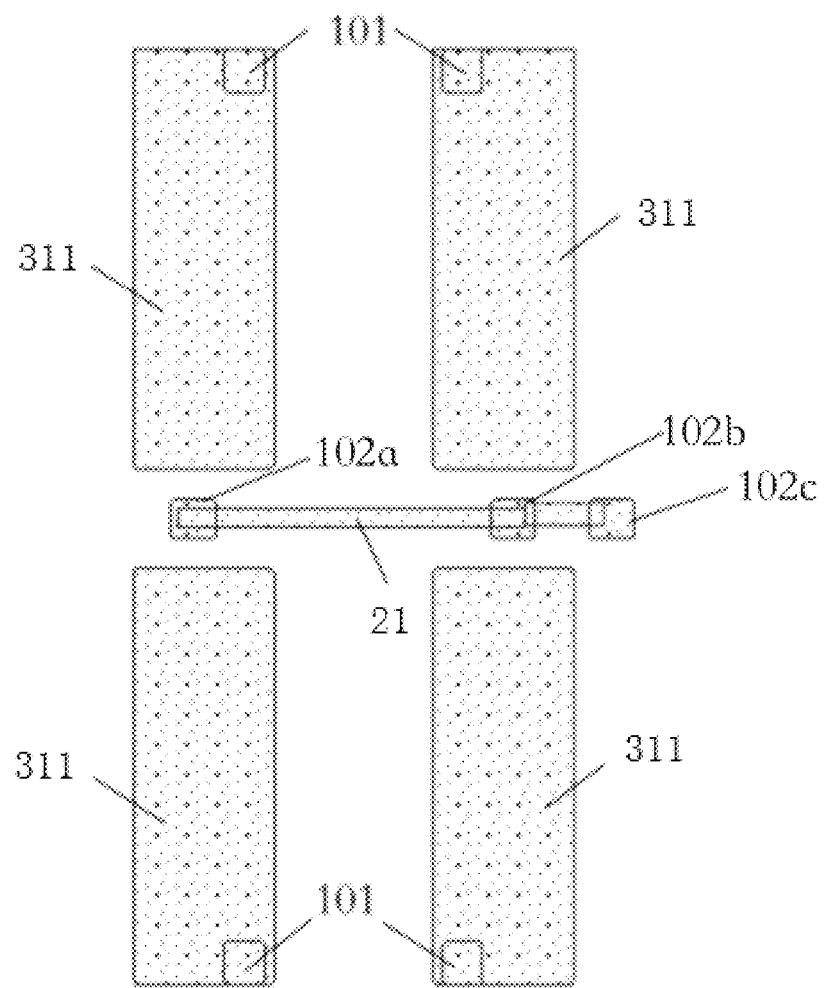
FIG. 10 is a layout of a layer where a light shielding layer in FIG. 9 is located.

In S02, the light shielding layer and the sensing connection line for connecting the drain 64 of the sensing transistor 6 in each pixel circuit to the sensing line 2 are formed on the base substrate 10, as shown in FIG. 10.

In the embodiment of the present disclosure, as shown in FIG. 10, the light shielding layer may be used as the first sub-electrode plate 311 of the first electrode of the storage capacitor 3. It should be noted here that, a position of each light shielding layer is marked with a small box denoted by 101. These four positions are positions where the light shielding layers are connected to the second sub-electrode plates 312 of the first electrodes of the storage capacitors 3. The insulation layer located between the light shielding layer and the layer where the second sub-electrode plate 312 is located will form a via in the corresponding small box 101. Three small boxes circled on the sensing connection line are denoted by 102a, 102b, and 102c, respectively, the positions of 102a and 102b each are positions where the drains 64 of the sensing transistors 6 of two sub-pixels 'a' above and below the positions 102a and 102b are connected to the first sensing connection line 21, respectively, and the position 102c is a position where the first sensing connection line 21 is connected to the sensing line 2; vias are provided at the positions 102a, 102b, and 102c in the insulation layers located between the layer where the first sensing connection line 21 is located and the drain 64 of the sensing transistor 6, and located between the layer where the first sensing connection line 21 is located and the sensing line 2.

In S03, the buffer layer 301 is formed on the base substrate 10 with the light shielding layer formed, and vias are formed at positions in the buffer layer 301 corresponding to the positions 101, 102a, 102b, and 102c.

Figure 11:
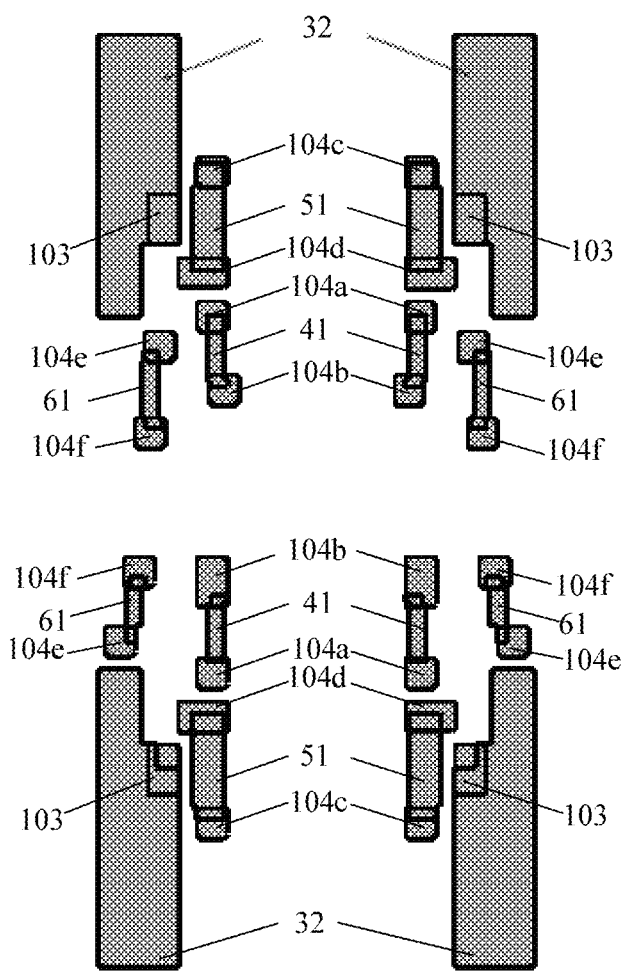
FIG. 11 is a layout of a semiconductor active layer in FIG. 9 is located.

S04, the semiconductor active layers of the switching transistor 4, the drive transistor 5 and the sensing transistor 6, and the second electrode 32 of the storage capacitor 3 in each sub-pixel 'a' are formed on the substrate 10 with the buffer layer 301 formed, as shown in FIG. 11.

It should be noted that, the position of the small box on the second electrode 32 of the storage capacitor 3 shown in FIG. 11 is denoted by 103, which is a position where the second electrode 32 of the storage capacitor 3 is connected to the gate 52 of the drive transistor 5 in the sub-pixel 'a'. Thus, a via is formed at the position 103 in the insulation layer located between the gate 52 of the drive transistor 5 and the second electrode 32 of the storage capacitor 3, so as to facilitate the connection between the second electrode 32 of the storage capacitor 3 and the gate 52 of the drive transistor 5. The two small boxes on the active layer of the switching transistor 4 in each sub-pixel 'a' are denoted as 104a and 104b, respectively, the two small boxes on the active layer of the drive transistor 5 are denoted as 104c and 104d, respectively, and the two small boxes on the active layer of the sensing transistor 6 are denoted as 104e and 104f, respectively; 104a and 104b correspond to the positions where the source 42 and the drain of the switching transistor 4 are connected to the semiconductor active layer of the switching transistor 4, respectively; 104c and 104d correspond to the positions where the source 53 and the drain of the drive transistor 5 are connected to the semiconductor active layer of the drive transistor 5, respectively; 104e and 104f correspond to the positions where the source 63 and the drain of the sensing transistor 6 are connected to the semiconductor active layer of the sensing transistor 6, respectively; thus, vias are formed at positions corresponding to 104a, 104b, 104c, 104d, 104e, and 104f in the insulation layer located between the layer where the semiconductor active layers of the switching transistor 4, the drive transistor 5 and the sensing transistor 6 are located and the layer where the sources and drains of the switching transistor 4, the drive transistor 5 and the sensing transistor 6 are located.

In S05, the gate insulation layer 302 is formed on the base substrate 10 with the semiconductor active layers of the switching transistor 4, the drive transistor 5 and the sensing transistor 6 formed, and vias are formed at positions of the gate insulation layer 302 corresponding to 101, 102a, 102b, 102c, 103, 104a, 104b, 104c, 104d, 104e, and 104f.

In S06, the gates of the switching transistor 4, the drive transistor 5 and the sensing transistor 6, the gate line 1, the control signal line, the first gate connection line 11, the first control signal connection line 14, the first sub-power line 81 of the first power line 8, the power connection line, the first sub-structure 91 of the supplementary cathode 9, and the data connection line 71 are formed on the base substrate 10 with the gate insulation layer 302 formed; the gate 52 of each drive transistor 5 is connected to the second electrode 32 of the storage capacitor 3 through the via at the position 103; in the pixel unit A, the gates 42 of the switching transistors 4 in the first row of sub-pixels 'a' are connected to the gate line 1 through the first gate connection line 11, and the gates 62 of the sensing transistors 6 in the second row of sub-pixels 'a' are connected to the control signal line 13 through the first control signal connection line 14; two sub-pixels 'a' in a same row correspond one first sub-power line 81, and the two sub-pixels 'a' are connected to the first sub-power line 81 through corresponding power connection lines, respectively; as shown in FIG. 12.

It should be noted here that, in the pixel unit A, the gates 42 of the switching transistors 4 in the first row of sub-pixels 'a', the first gate connection line 11 and the gate line may be of an integrated structure; the gates of the sensing transistors in the second row of sub-pixels 'a', the first control signal connection line 14 and the control signal line 13 may be of an integrated structure. As shown in FIG. 12, the boxes on the first structure of the supplementary cathode 9 in each sub-pixel 'a' are denoted by 105, the positions of 105 are connection positions between the first sub-structure 91 and the second sub-structure 92 of the supplementary 9, and thus vias are provided at the positions corresponding to 105 in the insulation layer located between the first sub-structure 91 and the second sub-structure 92 of the supplementary cathode 9. The boxes on each first sub-power line 81 and power connection line are denoted by 106a and 106b, respectively; the positions of 106a are connection positions between the first sub-power line 81 and the second sub-power line 82 of the first power line 8; the positions of 106b are connection positions between the power connection line and the source 53 of the drive transistor 5, and thus vias are formed at the positions corresponding to 106a and 106b in the insulation layer located between the layer where the first sub-power line 81 is located and the power connection line. The boxes on the gate line 1 are denoted by 107a and 107b, respectively, and the boxes on the gates 42 of the switching transistors 4 in the second row of sub-pixels 'a' are denoted by 107c and 107d, respectively; the positions of 107a and 107c are positions at which the gate 42 of the switching transistor 4 in the sub-pixel 'a' at the second row and the first column in the pixel unit A is connected to the gate line 1 through the second gate connection line 12; the positions of 107b and 107d are positions at which the gate 42 of the switching transistor 4 in the sub-pixel 'a' at the second row and the second column in the pixel unit A is connected to the gate line 1 through the second gate connection line 12, and thus, vias are formed at the positions corresponding to 107a, 107b, 107c and 107d in the insulation layer located between the layer where the gate 42 of the switching transistor 4 and the gate line 1 are located and the layer where the second gate connection line 12 is located. The box on the gate 52 of each drive transistor 5 is denoted by 108. The position of 108 is a connection position between the gate 52 of the drive transistor and the source 42 of the switching transistor 4 in each sub-pixel 'a'. Thus, a via is formed at the position corresponding to 108 in the insulation layer located between the layer where the gate 52 of the drive transistor 5 is located and the layer where the source 42 of the switching transistor 4 is located. The boxes on the control signal line 13 are denoted by 109a and 109b, respectively; the boxes on the gate 62 of the sensing transistor 6 in the first row of sub-pixels 'a' in the pixel unit A are denoted by 109c and 109d, respectively; the positions of 109a and 109c are connection positions at which the gate 62 of the sensing transistor 6 in the sub-pixel 'a' at the first row and the first column in the pixel unit A is connected to the control signal line 13 through the second sensing connection line 22; the positions 109b and 109d are connection positions at which the gate 62 of the sensing transistor 6 in the sub-pixel 'a' at the first row and the second column in the pixel unit A is connected to the control signal line 13 through the second sensing connection line 22. Thus, vias are formed at the positions corresponding to the positions of 109a, 109b, 109c and 109d in the insulation layer located between the layer where the gate 62 of the sensing transistor 6 and the control signal line 13 are located and the layer where the second sensing connection line 22 is located. The data connection lines 71 in the second row of sub-pixels 'a' in the pixel unit A are to prevent the four data lines 7 between the two columns of sub-pixels 'a' from being short-circuited when they are connected. It will be appreciated that, the two data connection lines 71 in the pixel unit A may be provided in any two of the four sub-pixels 'a', respectively. In the embodiment of the present disclosure, for example, the data connection lines 71 are located in the second row of sub-pixels 'a' in the pixel unit A, respectively. The two small boxes at both ends of the data connection line 71 in the sub-pixel 'a' at the second row and the first column in the pixel unit A are denoted by 110a and 110b, respectively, and the two small boxes at both ends of the data connection line 71 in the sub-pixel 'a' at the second row and the second column in the pixel unit A are denoted by 110c and 110d, respectively; the positions of 110a and 110c are connection positions between the drain 43 of the switching transistor 4 in each sub-pixel 'a' and the data connection line 71, respectively; the positions of 110b and 110d are connection positions between the data line 7 connected to each sub-pixel 'a' and the data connection line 71, respectively. Thus, vias are formed at positions corresponding to 110a, 110b, 110c and 110d in the insulation layer located between the layer where the data connection line 71 is located and the layer where the drain 43 of the switching transistor 4 and the data line 7 are located.

In S07, the interlayer insulation 303 is formed on the base substrate 10 with the gates of the switching transistor 4, the drive transistor 5 and the sensing transistor 6, the gate line 1, the control signal line, the first gate connection line 11, the first control signal connection line 14, the first sub-power line 81 of the power line 8, the power connection line, the first sub-structure 91 of the supplementary cathode 9, and the data connection line 71 formed, and vias are formed at positions in the interlayer insulation layer 303 corresponding to 101, 102a, 102b, 102c, 104a, 104b, 104c, 104d, 104e, 104f, 105, 106a, 106b, 107a, 107b, 107c, 107d, 108, 109a, 109b, 109c, 109d, 110a, 110b, 110c, and 110d.

In S08, the sources and drains of the switching transistor 4, the drive transistor 5 and the sensing transistor 6 in the pixel unit A, the first trace 201, the second trace 202, the second sub-electrode plate 312 of the first electrode of the storage capacitor 3, the second gate connection line 12, the second control signal connection line 15, the second sensing connection line 22, the second sub-power line 82 of the first power line 8, the second sub-structure 92 of the supplementary cathode 9, the data line 7, the second sensing connection line 22, and the sensing line 2 are formed on the base substrate 10 with the interlayer insulation layer 303 formed, as shown in FIG. 13. The first sub-electrode plate 311 and the second sub-electrode plate 312 of the first electrode of the storage capacitor 3 are connected through the via at the position 101. The drains 64 of the sensing transistors 6 in the same column in the pixel unit A are connected to their corresponding second sensing connection lines 22, respectively, the second sensing connection lines 22 are connected to the first sensing connection line 21 through the vias at positions of 102a and 102b, respectively, and the sensing line 2 is connected to the first sensing connection line 21 through the via 102c; the second sensing connection line 22 and the drains 64 of the sensing transistors 6 connected thereto may be of an integrated structure. The source 42 and the drain of the switching transistor 4 in each sub-pixel 'a' are connected to the semiconductor active layer 41 of the switching transistor 4 through the vias at the positions of 104a and 104b, respectively; the source 53 and the drain of the drive transistor 5 are connected to the semiconductor active layer 51 of the drive transistor 5 through the vias at the positions 104c and 104d, respectively; the source 63 and the drain of the sensing transistor 6 are connected to the semiconductor active layer 61 of the sensing transistor 6 through the vias at the positions of 104e and 104f, respectively. The source 53 of the drive transistor 5 is also connected to the second sub-electrode plate 312 of the first electrode of the storage capacitor 3, as shown in FIG. 13. In order to simplify the preparation process, the source 53 of the drive transistor 5 and the second sub-electrode plate 312 may be formed as an integrated structure. The first sub-structure 91 and the second sub-structure 92 of the supplementary cathode 9 are connected by the vias at the positions of 105. In order to ensure that the first sub-structure 91 and the second sub-structure 92 of the supplementary cathode 9 can be reliably connected, there are multiple positions of 105, that is, multiple vias are formed for the connection of the first sub-structure 91 and the second sub-structure 92. The second sub-power line 82 of the first power line 8 is connected to the first sub-power line 81 through the via at 106a. In order to ensure that the first sub-power line 81 and the second sub-power line 82 can be reliably connected, there are multiple positions of 106a, that is, multiple vias are formed for the connection of the first sub-power line 81 and the second sub-power line 82. The drain 54 of the drive transistor 5 is connected to the power connection line through the via at 106b, and the power connection line is connected to the first sub-power connection line. At this time, the connection between the drain 54 of the drive transistor 5 and the first power line 8 is completed. The gate 42 of the switching transistor 4 in the sub-pixel 'a' at the second row and the first column of the pixel unit A is connected to the second gate connection line 12, and the second gate connection line 12 is connected to the gate line 1 through the via at 107a, and the second gate connection line 12 may be formed as an integrated structure with the gate of the switching transistor; likewise, the gate 42 of the switching transistor 4 of the sub-pixel 'a' at the second row and the second column is connected to the second gate connection line 12. The second gate connection line 12 is connected to the gate line 1 through the via at 107b, and may be formed as an integrated structure with the gate of the switching transistor. The source 42 of the switching transistor 4 in each sub-pixel 'a' is connected to the first trace 201, and the first trace 201 is connected to the gate 52 of the drive transistor 5 through the via at the position of 108, that is, the connection of the gate 52 of the drive transistor 5 and the source 42 of the switching transistor 4 is completed. The source 63 of the sensing transistor 6 is connected to the source 53 of the drive transistor 5 through the first trace 201, and in order to simplify the process, the source 63 of the sensing transistor 6, the source 53 of the drive transistor 5, and the first trace 201 may be formed as an integrated structure. One end of the second control signal connection line 15 is connected to the control signal line 13 through the via at the position of 109a, and the other end of the second control signal connection line 15 is connected to the gate 62 of the sensing transistor 6 in the sub-pixel 'a' at the first row and the first column of the pixel unit A through the via at the position of 109c, so as to complete the connection between the gate 62 of the sensing transistor 6 in the sub-pixel 'a' at the first row and the first column of the pixel unit A and the control signal line; likewise, one end of the second control signal connection line 15 is connected to the control signal line 13 through the via at the position of 109b, and the other end of the second control signal connection line 15 is connected to the gate 62 of the sensing transistor 6 in the sub-pixel 'a' at the first row and the second column of the pixel unit A through the via at the position of 109d, so as to complete the connection between the gate 62 of the sensing transistor 6 in the sub-pixel 'a' at the first row and the second column of the pixel unit A and the control signal line. The drain 43 of the switching transistor 4 in the sub-pixel 'a' at the second row and the first column of the pixel unit A is connected to one end of the data connection line 71 through the via at the position of 110a, and the other end of the data connection line 71 is connected to the data line 7 corresponding to this sub-pixel a through the via at the position of 110b, so as to complete the connection between the drain 43 of the switching transistor 4 and the data line 7; likewise, the drain 43 of the switching transistor 4 in the sub-pixel a at the second row and the second column of the pixel unit A is connected to one end of the data connection line 71 through the via at the position of 110c, and the other end of the data connection line 71 is connected to the data line 7 corresponding to this sub-pixel a through the via at the position of 110d, so as to complete the connection between the drain 43 of the switching transistor 4 and the data line 7.

It should be noted here that the small box on the second sub-electrode plate 312 of the first electrode of the storage capacitor 3 is denoted by 111, where the position of 111 is a connection position between the second sub-electrode plate 312 of the storage capacitor 3 and the anode 401 of the organic electroluminescent diode OLED. Thus, a via is formed at the position corresponding to 111 in the insulation layer between the second sub-electrode plate 312 of the storage capacitor 3 and the anode 401 of the organic electroluminescent diode OLED.

In S09, the passivation layer 305 is formed on the base substrate 10 with the sources and drains of the switching transistor 4, the drive transistor 5 and the sensing transistor 6 in the pixel unit A, the first trace 201, the second trace 202, the second sub-electrode plate 312 of the first electrode of the storage capacitor 3, the second gate connection line 12, the second control signal connection line 15, the second sensing connection line 22, the second sub-power line 82 of the first power line 8, the second sub-structure 92 of the supplementary cathode 9, the data line 7, the second sensing connection line 22, and the sensing line 2 formed, and a via is formed at a position in the passivation corresponding to 111.

In S10, the connecting electrode is formed on the base substrate 10 with the passivation layer 305 formed, the connecting electrode being connected to the first sub-electrode plate 311 of the storage capacitor 3 through the via at the position of 111. Since the first sub-electrode plate 311 is formed as an integrated structure with the source 53 of the drive transistor 5 and the source 63 of the sensing transistor 6, the connecting electrode is connected to both the source 53 of the drive transistor 5 and the source 63 of the sensing transistor 6 at the same time through the via at the position of 111.

In S11, the planarization layer 304 is formed on the base substrate 10 with the connecting electrode formed, and a via is formed at a position in the planarization 304 corresponding to 111.

In S12, the anode 40 of the organic electroluminescent diode OLED is formed on the base substrate 10 with the planarization layer 304 formed, the anode being connected to the connecting electrode through the via at 111.

In S13, the pixel definition layer 306, and the light emitting layer 403 and the cathode of the organic electroluminescent diode OLED are sequentially formed on the base substrate 10 with the anode 401 of the organic electroluminescent diode OLED formed, the cathode being connected to the second sub-structure 92 of the supplementary cathode 9.

At this point, the preparation of the display substrate is completed.

In a second aspect, an embodiment of the present disclosure further provides a display device. The display device includes the aforementioned display substrate. The display device can be, for example, an electronic device with a display panel, such as a mobile phone, a tablet computer, an electronic watch, a sports bracelet, a notebook computer, or the like. The technical effects of the display device can be referred to the above discussion on the technical effects of the display substrate, which will not be repeated here.

It will be appreciated that the above implementations are merely exemplary implementations used to illustrate the principle of the present disclosure, but the present disclosure is not limited thereto. For those of ordinary skill in the art, various modifications and improvements can be made without departing from the spirit and essence of the present disclosure, and these modifications and improvements are also regarded as the protection scope of the present disclosure.

What is claimed is:

1. A display substrate, comprising: a base substrate, and a plurality of gate lines extending in a first direction, a plurality of data lines extending in a second direction and a plurality of pixel units that are provided on the base substrate, the first direction intersecting the second direction;
   each of the plurality of pixel unit comprising a plurality of sub-pixels, each of the plurality of sub-pixels comprising a pixel circuit; the pixel circuit comprising at least a switching transistor, a drive transistor, a sensing transistor, a storage capacitor, and an organic electroluminescent diode;
   wherein for each pixel circuit, the switching transistor, the drive transistor, and the sensing transistor of the pixel circuit are all located on a same side of the storage capacitor, the switching transistor is located at an intersection of the gate line and the data line that both coupled to the switching transistor, and the switching transistor is adjacent to the sensing transistor in the first direction, and adjacent to the drive transistor in the second direction,
   wherein the plurality of pixel units are arranged in a plurality of columns and a plurality of rows, the first direction being row direction and the second direction being column direction; the plurality of sub-pixels in each pixel unit are arranged in two rows, and the sub-pixels in each row are arranged in the first direction,
   each gate line is coupled to control electrodes of the switching transistors of pixel circuits of the sub-pixels in the pixel units located in a same row, and is located between the two rows of sub-pixels in each pixel unit in the same row, and
   each data line is coupled to the switching transistors of the pixel circuits, in which organic electroluminescent diodes emit light with a same color, in the pixel units in a same column.

2. The display substrate of claim 1, wherein for the two rows of sub-pixels in each row of pixel units, the control electrodes of the switching transistors of the sub-pixels in one row are coupled to the gate line corresponding to the row through respective first gate connection lines, the control electrodes of the switching transistors of the sub-pixels in the other row are coupled to the gate line corresponding to the other row through respective second gate connection lines, the first gate connection lines and the gate lines are in a same layer with respect to the base substrate and made of a same material, and the second gate connection lines and the data lines are in a same layer with respect to the base substrate and made of a same material, a first insulation layer is between the gate line and the data line, and the second gate connection lines are coupled to the gate line through a via penetrating the first insulation layer.

3. The display substrate of claim 1, wherein the data line coupled to a corresponding column of pixel units is between the two columns of sub-pixels in the corresponding column of pixel units.

4. The display substrate of claim 1, further comprising a first power line, wherein first electrodes of the drive transistors of the pixel circuits in each column of pixel units are coupled to the first power line, and the first power line is between the two columns of sub-pixels in the pixel units corresponding to the first power line.

5. The display substrate of claim 4, wherein the first power line comprises a first sub-power line and a second sub-power line that are electrically coupled to each other, the first sub-power line and the gate line are in a same layer with respect to the base substrate and made of a same material, and the second sub-power line and the data line are in a same layer with respect to the base substrate and made of a same material.

6. The display substrate of claim 1, further comprising a plurality of control signal lines, each of which is coupled to the control electrodes of the sensing transistors of the pixel units in a same row.

7. The display substrate of claim 6, wherein the control signal line coupled to each row of pixel units is between the two rows of sub-pixels of the row of pixel units.

8. The display substrate of claim 7, wherein the control signal line and the gate line are in a same layer with respect to the base substrate and made of a same material, for the two rows of sub-pixels in each row of pixel units, control electrodes of the sensing transistors of the sub-pixels in one row are coupled to the control signal line through first control signal connection lines, the control electrodes of the sensing transistors of the sub-pixels in the other row are coupled to the control signal line through second control signal connection lines, the first control signal connection lines and the control signal lines are in a same layer with respect to the base substrate and made of a same material, and the second control signal connection lines and the data lines are in a same layer with respect to the base substrate and made of a same material, a first insulation layer is further provided between the gate line and the data line, and the second control signal connection lines are coupled to the control signal line through vias penetrating the first insulation layer.

9. The display substrate of claim 1, further comprising a plurality of sensing signal lines, wherein second electrodes of the sensing transistors in the pixel units in a same column are coupled to a same sensing line among the plurality of sensing signal lines.

10. The display substrate of claim 9, wherein the sensing lines and the data lines are in a same layer with respect to the base substrate and made of a same material.

11. The display substrate of claim 1, wherein the plurality of sub-pixels are arranged in two columns and two rows.

12. The display substrate of claim 1, further comprising a plurality of light-transmission units, through which a side of the display substrate opposite to a display side is visible; wherein the light-transmission units and the pixel units are arranged alternately in the first direction and/or the light-transmission units and the pixel units are arranged alternately in the second direction.

13. The display substrate of claim 1, wherein each of the switching transistor, the drive transistor, and the sensing transistor comprises a semiconductor active layer, a control electrode, and first and second electrodes provided in a same layer with respect to the base substrate, which are provided sequentially on the base substrate, a metal light shielding layer and a buffer layer are sequentially provided between the semiconductor active layer and the base substrate, a gate insulation layer is between a layer where the control electrode is located and the semiconductor active layer, and an interlayer insulation layer is between the control electrode and the source and drain.

14. The display substrate of claim 13, wherein the storage capacitor comprises a first electrode and a second electrode, the second electrode comprises the metal light shielding layer and a second sub-electrode plate, the first electrode and the semiconductor active layer are in a same layer with respect to the base substrate and made of a same material, the second sub-electrode plate and the source of the drive transistor are in a same layer with respect to the base substrate and made of a same material, and the metal light shielding layer and the second sub-electrode plate are coupled to each other through a via penetrating the buffer layer, the gate insulation layer, the interlayer insulation layer.

15. The display substrate of claim 13, wherein the control electrode of the drive transistor in each pixel circuit is coupled to the source of the switching transistor through a first trace, and the source of the drive transistor is coupled to the source of the sensing transistor through a second trace, and the first trace, the second trace and the source of the drive transistor are in a same layer with respect to the base substrate and made of a same material.

16. The display substrate of claim 13, further comprising a supplementary cathode; wherein the supplementary cathode comprises a first sub-structure and a second sub-structure sequentially provided on the base substrate, the first sub-structure and the control electrode of the drive transistor are in a same layer with respect to the base substrate and made of a same material, the second sub-structure and the source of the drive transistor are in a same layer with respect to the base substrate and made of a same material, and the first sub-structure and the second sub-structure are coupled to each other through a via penetrating the interlayer insulation layer.

17. The display substrate of claim 16, wherein the supplementary cathode extends in the second direction, each column of sub-pixels are provided with one supplementary cathode on a side of the column of sub-pixels, and adjacent columns of supplementary cathodes are separated by one column of sub-pixels.

18. The display substrate of claim 13, further comprising a passivation layer, a connecting electrode, and a planarization layer provided sequentially between the source and the drain of the drive transistor and a layer where an anode of the organic electroluminescent diode is located, wherein the connecting electrode is coupled to the drain of the drive transistor through a via penetrating the passivation layer, and the anode of the organic electroluminescent diode is coupled to the connecting electrode through a via penetrating the planarization layer.

* * * * *